(12) United States Patent
Chinnakkonda Vidyapoornachary et al.

(10) Patent No.: US 10,078,447 B2
(45) Date of Patent: Sep. 18, 2018

(54) MEMORY ACTIVITY DRIVEN ADAPTIVE PERFORMANCE MEASUREMENT

(71) Applicant: International Business Machines Corporation, Armonk, NY (US)

(72) Inventors: Diyanesh B. Chinnakkonda Vidyapoornachary, Bangalore (IN); Srinivas B. Purushotham, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 14/933,575

(22) Filed: Nov. 5, 2015

(65) Prior Publication Data

US 2017/0060423 A1    Mar. 2, 2017

Related U.S. Application Data

(63) Continuation of application No. 14/840,503, filed on Aug. 31, 2015.

(51) Int. Cl.
*G06F 12/02* (2006.01)
*G06F 3/06* (2006.01)
(Continued)

(52) U.S. Cl.
CPC ............ *G06F 3/0604* (2013.01); *G06F 1/20* (2013.01); *G06F 3/0634* (2013.01);
(Continued)

(58) Field of Classification Search
CPC .... G06F 3/0604; G06F 3/0622; G06F 3/0634; G06F 3/067; G06F 3/0605; G06F 3/0659
See application file for complete search history.

(56) References Cited

U.S. PATENT DOCUMENTS 6,003,111 A    12/1999  Holman et al.
6,035,378 A *   3/2000  James ................. G06F 12/0813
                                                    709/214
(Continued)

OTHER PUBLICATIONS

Chinnakkonda Vidyapoornachary, et al., "Memory Activity Driven Adaptive Performance Measurement", U.S. Appl. No. 14/840,503, filed Aug. 31, 2015.

(Continued)

*Primary Examiner* — Ryan Bertram
*Assistant Examiner* — Trang Khanh Ta
(74) *Attorney, Agent, or Firm* — Michael Purdham

(57) ABSTRACT

A method of monitoring memory performance comprises selecting a first portion of memory from two or more portions of memory in accordance with an adaptive mode indicated by configuration bits in a control register; monitoring memory accesses to the selected portion of memory during a first sampling period; selecting a different portion of memory from the two or more portions of memory in accordance with the adaptive mode for monitoring the different portion of memory in a subsequent sampling period; monitoring memory accesses to the different portion of memory during the subsequent sampling period; recording a respective number of memory accesses for each portion of memory over a plurality of sampling periods; and generating one or more interrupts to output data regarding the monitored memory accesses for data analysis.

14 Claims, 7 Drawing Sheets

(51) Int. Cl.
*G06F 1/20* (2006.01)
*G11C 16/10* (2006.01)
*G11C 5/14* (2006.01)
*G11C 7/04* (2006.01)
*G11C 7/24* (2006.01)
*G11C 29/02* (2006.01)
*G11C 29/04* (2006.01)

(52) U.S. Cl.
CPC ............ *G06F 3/0673* (2013.01); *G11C 5/143* (2013.01); *G11C 7/04* (2013.01); *G11C 7/24* (2013.01); *G11C 16/10* (2013.01); *G11C 29/027* (2013.01); *G11C 29/028* (2013.01); *G11C 2029/0409* (2013.01)

(56) References Cited

U.S. PATENT DOCUMENTS

| | | | | |
|---|---|---|---|---|
| 6,339,818 | B1* | 1/2002 | Olszewski | G06F 11/3409 711/133 |
| 7,353,325 | B2 | 4/2008 | Lofgren et al. | |
| 2005/0081010 | A1 | 4/2005 | DeWitt, Jr. et al. | |
| 2007/0195631 | A1* | 8/2007 | Hoffmann | G11C 7/06 365/230.03 |
| 2010/0318719 | A1 | 12/2010 | Keays et al. | |
| 2012/0203951 | A1* | 8/2012 | Wood | G11C 16/28 711/102 |
| 2013/0268741 | A1 | 10/2013 | Daly et al. | |
| 2014/0195852 | A1 | 7/2014 | Gollub et al. | |
| 2015/0106649 | A1* | 4/2015 | Kannan | G06F 1/08 713/501 |
| 2015/0143200 | A1 | 5/2015 | Chinnakkonda Vidyapoornachary et al. | |
| 2015/0199149 | A1* | 7/2015 | Sankaranarayanan | G06F 3/0653 711/102 |
| 2016/0034206 | A1* | 2/2016 | Ryan | G11C 16/349 711/103 |
| 2016/0179386 | A1 | 6/2016 | Zhang | |
| 2016/0188455 | A1* | 6/2016 | Patel | G06F 12/0246 711/154 |

OTHER PUBLICATIONS

List of IBM Patents or Patent Applications Treated as Related, dated Nov. 3, 2015. 2 pages.

* cited by examiner

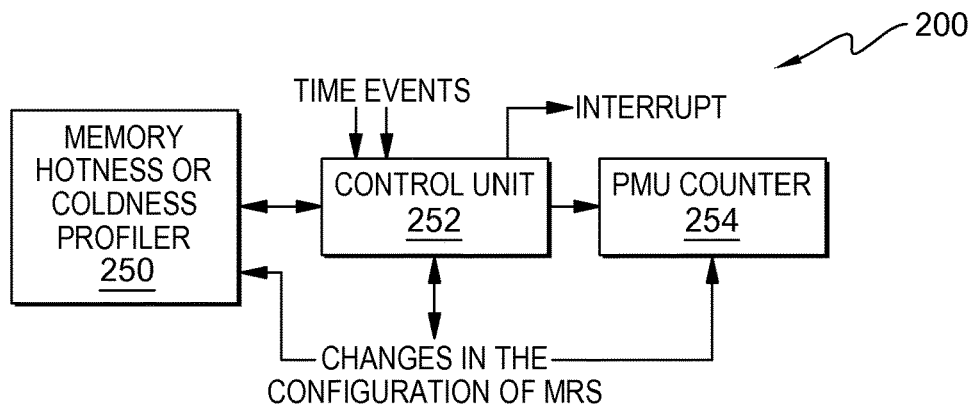
FIG. 2
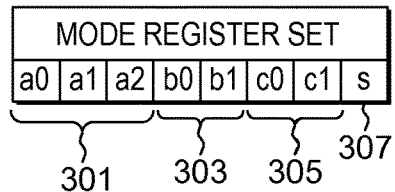
FIG. 3
| b0 | b1 | |
|---|---|---|
| 0 | 0 | SELECT RANK_N |
| 0 | 1 | SELECT RANK_N+1 |
| 1 | 0 | RANK_N OR RANK_N+1 |
| 1 | 1 | RANK_N AND RANK_N+1 |
FIG. 4
| c0 | c1 | |
|---|---|---|
| 0 | 0 | SELECT BANK_N |
| 0 | 1 | SELECT BANK_N+1 |
| 1 | 0 | BANK_N OR BANK_N+1 |
| 1 | 1 | BANK_N AND BANK_N+1 |
FIG. 5

| s | EVENT LEVEL SELECTION |
|---|---|
| 0 | SELECT BUFFER LEVEL |
| 1 | SELECT RANK/BANK LEVEL |

| a0 | a1 | a2 | |
|---|---|---|---|
| 0 | x | x | USER CONFIGURED |
| 1 | x | x | ADAPTIVE SETTING |
| 1 | 0 | 0 | TRACK CACHE HOTNESS |
| 1 | 0 | 1 | TRACK CACHE COLDNESS |
| 1 | 1 | 1 | ROUND ROBIN |

MEMORY ACTIVITY DRIVEN ADAPTIVE PERFORMANCE MEASUREMENT

BACKGROUND

Typically in a microprocessor, on-chip trace arrays are provided to capture data for debug of specific events or transactions. It also typically has built-in features like performance monitors to monitor and collect data for performance analysis.

SUMMARY

In one embodiment, a method of monitoring memory performance is provided. The method comprises selecting a first portion of memory from two or more portions of memory in accordance with an adaptive mode indicated by configuration bits in a control register; monitoring memory accesses to the selected portion of memory during a first sampling period; selecting a different portion of memory from the two or more portions of memory in accordance with the adaptive mode for monitoring the different portion of memory in a subsequent sampling period; monitoring memory accesses to the different portion of memory during the subsequent sampling period; recording a respective number of memory accesses for each portion of memory over a plurality of sampling periods; and generating one or more interrupts to output data regarding the monitored memory accesses for data analysis.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which:

FIG. 2 is a block diagram of one embodiment of an illustrative performance measurement component.

FIG. 3 depicts a portion of one embodiment of an illustrative enhanced Mode Register Set.

FIG. 4 is one embodiment of an illustrative table depicting example values for a rank select field of a Mode Register Set.

FIG. 5 is one embodiment of an illustrative table depicting example values for a bank select field of a Mode Register Set.

Figure 1:
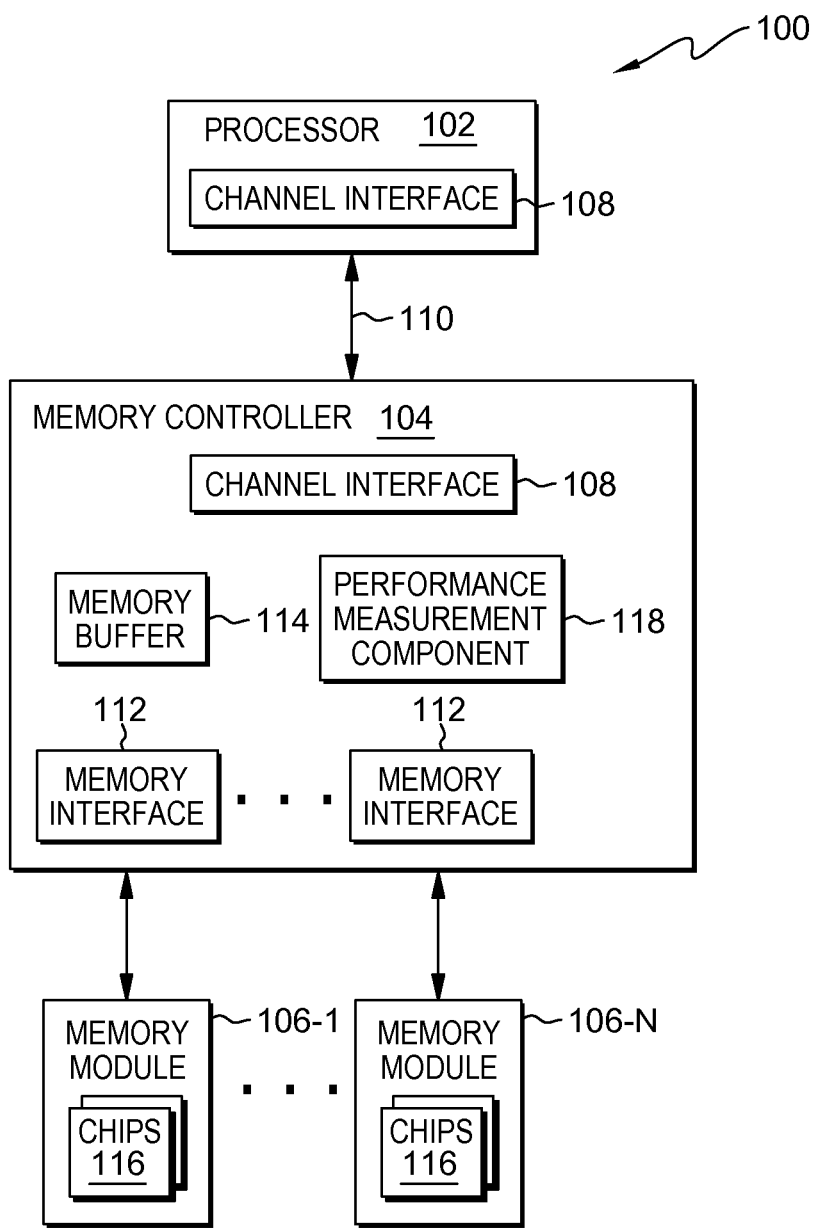
FIG. 1 is a block diagram of one embodiment of an illustrative memory sub-system.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual acts may be performed. The following detailed description is, therefore, not to be taken in a limiting sense.

FIG. 1 is a block diagram of one embodiment of an illustrative memory sub-system 100. The system 100 includes a processor 102, a memory controller 104, and a plurality of memory modules 106-1 . . . 106-N, where N is the total number of memory modules. Notably, although only 2 memory modules 106 are shown in FIG. 1, it is to be understood that more or fewer than 2 memory modules can be used in other embodiments. In addition, in some embodiments, each of the memory modules 106 is implemented as a Dual In-Line Memory Module (DIMM) known to one of skill in the art. However, other types of memory modules, such as small outline dual in-line memory module (SO-DIMM), can be used in other embodiments. Furthermore, the memory modules 106 can be implemented using any suitable random access memory (RAM) technology, such as, but not limited to dynamic random access memory (DRAM), synchronous DRAM (SDRAM), single data rate SDRAM (SDR SDRAM) and any generation of double data rate SDRAM (DDR SDRAM).

The processor 102 and the memory controller 104 each include a respective channel interface 108 for communicating over one or more channels 110. In addition, the memory module 104 includes one or more memory interfaces 112, each memory interface 112 corresponding to a respective one of the memory modules 106. In the embodiment shown in FIG. 1, the memory controller 104 also includes a memory buffer 114. However, it is to be understood that in other embodiments, one or more memory buffers are implemented external to and coupled to the memory controller 104 as opposed to being implemented as an internal component of the memory controller 104.

As understood by one of skill in the art, each of the memory modules 106 is comprised of a plurality of memory chips 116. Each memory chip 116 is a component integrated circuit (IC) having a specific density measured in bits, as understood by one of skill in the art. Furthermore, each memory module 106 is divided into ranks, where each rank includes a subset of the memory chips 116 that share a common address and data buses. For example, if a rank is defined as 64 bits wide, then a memory module having 8 chips on each side of the memory module, with each chip having an 8-bit wide data bus, would have 2 ranks. Similarly, in another example having a 64-bit wide memory data interface, a module having 8 chips on each side, with each chip having a 16-bit wide data bus, would have 4 ranks. Each rank can be selected by the memory controller 104 using a Chip Select signal, as known to one of skill in the art.

Furthermore, as understood by one of skill in the art, each memory chip 116 can be sub-divided into one or more banks. Whereas a rank is comprised of a subset of memory chips 116 in a memory module 106, a bank is comprised of sub-units of a single memory chip 116. Banks can be selected by the memory controller 104 using Bank Select bits which are part of the corresponding memory interface 112, as understood by one of skill in the art.

The memory controller 104 also includes a performance measurement component 118. The performance measurement component 118 can be implemented using techniques and components known to one of skill in the art such as, but not limited to, application specific integrated circuits (ASIC), field programmable gate arrays (FPGA), and/or processor readable instructions stored on a processor readable medium and executed by a processor. The performance measurement component 118 is implemented as a part of the memory controller 104 in this example. However, it is to be understood that, in other embodiments, the performance measurement component 118 can be implemented as part of other devices. For example, in embodiments having an external memory buffer, the performance measurement component 118 can be implemented as a component of the external memory buffer.

The performance measurement component 118 is configured to adaptively monitor traffic of different Ranks and/or Banks. The results of the adaptive monitoring by the performance measurement component 118 enables the processor 102 to estimate the amount of traffic that is localized across the memory subsystem 100. By monitoring traffic access patterns across the memory subsystem 100, modifications can be made to improve performance and/or quality of the memory sub-system 100. For example, modifications can be made to improve energy efficiency by modifying code and adjusting the amount of energy supplied to a particular portion of the memory sub-system based on the monitored traffic patterns. Additionally, in some embodiments, the monitored traffic patterns are used to provide information regarding customer workload patterns, such as, whether the workload patterns are processor bounded or memory bounded. Based on that knowledge, modifications to the code can be made to provide quality improvements.

Thus, the adaptive monitoring described herein, can be used in both run-time and test environments. For example, if considering run-time energy use in a customer environment, then the adaptive monitoring enabled by the performance measurement component 118 is used at run-time. However, in embodiments considering test quality improvements, the adaptive monitoring enabled by the performance measurement component 118 is used in a testing environment. Additional details regarding the performance measurement component 118 are described below with respect to FIG. 2.

FIG. 2 is a high level block diagram depicting one embodiment of an illustrative performance measurement component 200. In the example shown in FIG. 2, the performance measurement component 200 includes a memory hotness or coldness profiler 250 (also referred to herein simply as memory profiler 250), a control unit 252, and a performance monitoring unit (PMU) counter 254.

The PMU counter 254 includes a fixed number of counters each configured to count memory access events, such as read and write events. For example, the PMU counter 254 can be coupled to an event bus used to signal when an event has occurred, as understood by one of skill in the art. In particular, in some embodiments utilizing the event bus, each individual event is assigned to an individual bit of the event bus which is asserted for one cycle each time the event occurs.

The memory profiler 250 is configured to record the number of memory access events for the memory buffer, as well as ranks and banks of the memory modules based on the counts provided by the PMU counter 254. Thus, the recorded number of memory access events indicates the hotness or coldness of a given portion of the memory sub-system. For example, the more memory access events for a given portion of the memory module, the hotter that portion of the memory module is. Similarly, the less memory access events for a given portion of the memory module, the colder that portion of the memory module is.

The control unit 252 is configured to enable adaptive monitoring of the memory sub-system by changing configuration bits of an enhanced Mode Register Set (MRS). For example, FIG. 3 includes a portion of an enhanced Mode Register Set 300. The enhanced MRS 300 includes an adaptive mode field 301, a rank select field 303, a bank select field 305, and a device level select field 307. It is to be understood that in other embodiments, other bits or fields can be included in the Mode Register Set 300 in addition to those depicted in FIG. 3.

An illustrative table depicting example values for the rank select field 303 is depicted in FIG. 4. Similarly, an illustrative table depicting example values for the bank select field 305 is depicted in FIG. 5. As shown in the tables in FIGS. 4 and 5, a given rank and/or bank can be selected based on the chosen values of the rank select field 303 and bank select field 305. The device level select field 307 is used to select monitoring either events at the memory buffer level or at the memory module (rank/bank) level. That is, the tracking performed by the memory controller 104 can monitor events at the level of the memory buffer 114 or at the Rank/Bank level of a memory module 116. An illustrative table depicting example values for the device level select field 307 is shown in FIG. 6.

Figures 6, 7, 8, 9:
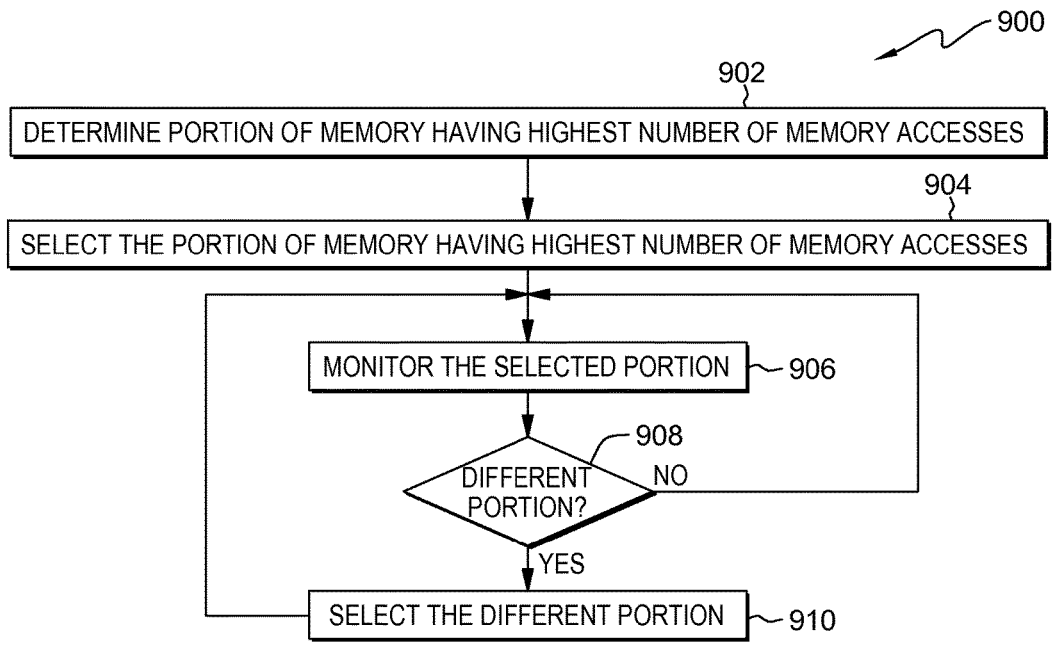
FIG. 6 is one embodiment of an illustrative table depicting example values for a device level select field of a Mode Register Set.
FIG. 7 is one embodiment of an illustrative table depicting example values for an adaptive mode field of a Mode Register Set.
FIG. 8 is a flow chart depicting one embodiment of an illustrative method of monitoring memory performance.
FIG. 9 is a flow chart depicting one embodiment of an illustrative method of adaptively monitoring memory accesses based on a track hotness mode.

FIG. 7 shows an illustrative table depicting example values for the adaptive mode field 301. In particular, the control unit 252 is configured to adapt the monitoring mode based on the values of the configuration bits in adaptive mode field 301 of the enhanced Mode Register Set 300. As shown in FIG. 7, the bit A0 indicates whether the monitoring is set to a mode configured by a user or to an adaptive mode. In particular, the example shown in FIG. 7 includes three adaptive modes which are set by the values for bits A1 and A2. The first adaptive mode is to track cache hotness. The second adaptive mode is to track cache coldness. As used herein, cache hotness and cache coldness refers to the amount of memory accesses (e.g. read and write accesses) generated for a memory module 106 within a specified time period. The cache hotness or coldness can be determined for a portion of a memory module (e.g. a particular rank or bank) or for the whole memory module 106.

Thus, when set to track cache hotness or coldness, the control unit 252 uses data from the memory hotness or coldness profiler 250 to identify the memory portions to monitor. Based on the data from the memory hotness or coldness profiler 250, the control unit 252 sets respective configuration bits to monitor the identified memory portions. For example, in some embodiments, the control unit 252 identifies the hottest or coldest memory portions for tracking cache hotness or coldness, respectively. In particular, when cache hotness is chosen, then the rank that has the highest traffic (i.e. hottest rank) is selected and banks of that rank will be monitored for the next sampling period. When cache coldness is chosen, then the rank with minimum traffic (i.e. coldest rank) is chosen and the banks of that particular rank are monitored in the next sampling period. As the relative hotness or coldness of specific ranks changes, as indicated by the memory hotness or coldness profiler 250, the control unit 252 updates which portions of memory to monitor for corresponding subsequent sampling periods.

The third adaptive mode is a round robin in which the monitoring is periodically switched between rank level events and bank level events. That is, the monitoring is looped over each rank and bank. In some embodiments, the switching of the round robin mode also includes memory buffer level events. The periodicity of the switching and the length of time for monitoring each level are parameters which can be set or programmed by a user. Alternatively, the parameters can be determined dynamically based on, for example, the relative hotness or coldness of the memory modules or portions thereof. For example, in some embodiments, the length of time for monitoring a given bank or rank is increased for portions having a cache hotness above a given threshold and decreased for portions having a cache hotness below a given threshold.

Based on the adaptive monitoring of memory accesses, the memory controller 104 is able to scan through channels to get an estimate of how the read/write accesses are going through at both a rank and bank level. Thus, the memory controller 104 is configured to provide a view into how the memory sub-system as a whole is accessed as well as provide information on how a particular portion of memory is accessed.

In operation, the control unit 252 receives user input, such as a user controlled time period and user determined event level to monitor. Based on the user input, the control unit 252 makes changes in the configuration of the control register (e.g. the enhanced Mode Register Set) to adaptively monitor the memory accesses. For example, the user controlled time period can specify the time period for checking the relative hotness or coldness of ranks. Thus, based on the user controlled time period, the control unit 252 checks the data from the memory hotness or coldness profiler 250 to determine which rank is the hottest or coldest, depending on the adaptive mode set, as discussed above. Based on the data from the memory hotness or coldness profiler 250, the control unit 252 selects the rank and banks to be monitored for the next time period when set to track memory hotness or coldness. When to set to a round robin, the user controlled time period can specify the length of time each rank and/or bank is to be monitored. During the time period, the PMU counter 254 tracks the number of write and read accesses for the specified rank and banks.

In addition, the control unit 252 generates interrupts so that data from the PMU counter 254 can be dumped or a trace can be created to enable data analysis to be performed on the data from the PMU counter 254. For example, the data from the PMU counter 254 can be provided to the processor 102 for data analysis, in some embodiments. The interrupts can be generated by the control unit 252 periodically so that the dump of the PMU counter 254 can be captured as a trace in software. In addition to or in lieu of generating the interrupts periodically, the control unit 252 can be configured to generate the interrupts once a PMU counter 254 freezes or reaches a specified number of counts.

The adaptive monitoring enabled by the embodiments of the performance measurement component discussed herein can be used to provide numerous benefits to the memory sub-system. For example, through the adaptive measurement, data access distribution to various portions of memory modules can be determined. Knowledge of the data access distribution can in turn be used to configure cooling algorithms to provide finer granularity in cooling energy levels provided to different portions of the memory modules which improves energy use efficiency.

The adaptive monitoring also enables analysis of workload and usage patterns. For example, the adaptive monitoring can be used to provide statistics regarding which portion of memory modules (e.g. ranks) are utilized and how often. The utilization monitor can be based on hotness (e.g. banks of those ranks that consume higher memory bandwidth) or coldness of the memory (e.g. banks of those ranks that consume less memory bandwidth). Thus, a detailed memory characterization can be developed for both a peak bandwidth driving workload (e.g. hotness profile) and a low bandwidth workload (e.g. coldness profile).

In addition, test quality can be improved through the adaptive monitoring described herein. For example, the adaptive monitoring enables quantifying read and write accesses for each monitored rank. Thus, a rank level stress distribution across all of the memory modules in the memory sub-system can be determined. Thus, the testing process can be improved by ensuring that each of the modules is stressed enough which results in higher field quality (e.g. less manufacturing escapes). In addition, the adaptive monitoring for improving test quality enables collection of data to better understand how the memory sub-system behaves when peak bandwidth workload is run and how the power management is handled when low workload bandwidth is run.

Another potential improvement based on the adaptive monitoring enabled by the embodiments described herein is related to improving test content. That is, based on the finer granularity of the test results provided by the adaptive monitoring, the test content can be fine-tuned to reduce the test time on the manufacturing floor. It is to be understood that the above advantages are not to be construed as limiting and that other advantages can be enabled by the embodiments described herein.

FIG. 8 is a flow chart depicting one embodiment of an illustrative method 800 of monitoring memory performance. The method 800 can be implemented by the performance measurement component described above with respect to FIGS. 1 and 2. It is to be understood that the order of the blocks depicted in FIG. 8 is not to limit the order in which the individual acts are performed. In particular, the individual acts can be performed simultaneously or in a different order than that shown in FIG. 8.

At block 802, the performance measurement component adaptively monitors memory accesses during respective sampling periods. As used herein, adaptively monitoring refers to automatically adjusting the portion of the memory being monitored in accordance with an adaptive mode indicated by bits set in a control register as discussed above. For example, the adaptive mode can be one of a track hotness mode, a track coldness mode, and a round robin mode as discussed above. The track hotness mode, track coldness mode, and round robin mode of adaptively monitoring memory accesses are described in more detail below with respect to the example flow charts depicted in FIGS. 9, 10, and 11, respectively.

At block 804, a cumulative number of counts for each portion of the memory is recorded. A count refers to a memory access, such as a read or write access. For example, a cumulative number of counts for each rank and each bank of each memory module can be maintained by a profiler, such as profiler 250 discussed above. In some embodiments, the cumulative number of counts is used by the performance measurement component to adaptively change which portion of memory is being monitored as discussed in more detail below. At block 806, one or more interrupts are periodically generated to provide data regarding the monitored memory accesses to a processor for data analysis, as discussed above. In particular, the interrupts can be generated at predetermined time intervals and/or when a counter configured to count the number of memory accesses has reached a predetermined limit.

FIG. 9 is a flow chart depicting one embodiment of an illustrative method 900 of adaptively monitoring memory accesses based on a track hotness mode. At block 902, the portion of memory (e.g. rank) having the highest number of memory accesses during a given time window is determined. For example, in some embodiments, the cumulative count discussed above, can be maintained for a moving window of previous sampling periods. Thus, in such embodiments, the portion of memory having the highest cumulative count for the moving time window is determined.

At block 904, the portion of memory having the highest cumulative count is selected for monitoring in a next sampling period. For example, in some embodiments, the banks of a rank having the highest cumulative count during the given time window are selected for monitoring during the next sampling period. Selecting the portion of memory having the highest number of memory accesses can include setting the corresponding bits in the Mode Register Set, as discussed above. At block 906, the selected portion of memory is monitored for memory accesses (e.g. read and write accesses). At block 908, it is determined if a different portion of memory has a higher cumulative count. For example, in embodiments having a moving time window, the portion of memory having the highest cumulative count may change as a result of moving the time window. If the portion of memory having the highest cumulative count is the same, then the method 900 returns to block 906 where the selected portion of memory is monitored for the next subsequent sampling period. If a different portion of memory has the highest cumulative count, then the different portion of memory is selected for monitoring during the next subsequent sampling period at block 910. At block 906, the different portion of memory is monitored. The method 900 then returns to block 908 to determine if a new portion of memory different from the one previously monitored has the highest cumulative count (e.g. is the hottest portion of memory). The method 900 then continues in this loop to adaptively change which portion of memory is monitored based on the relative hotness of the respective portions of memory.

Figure 10:
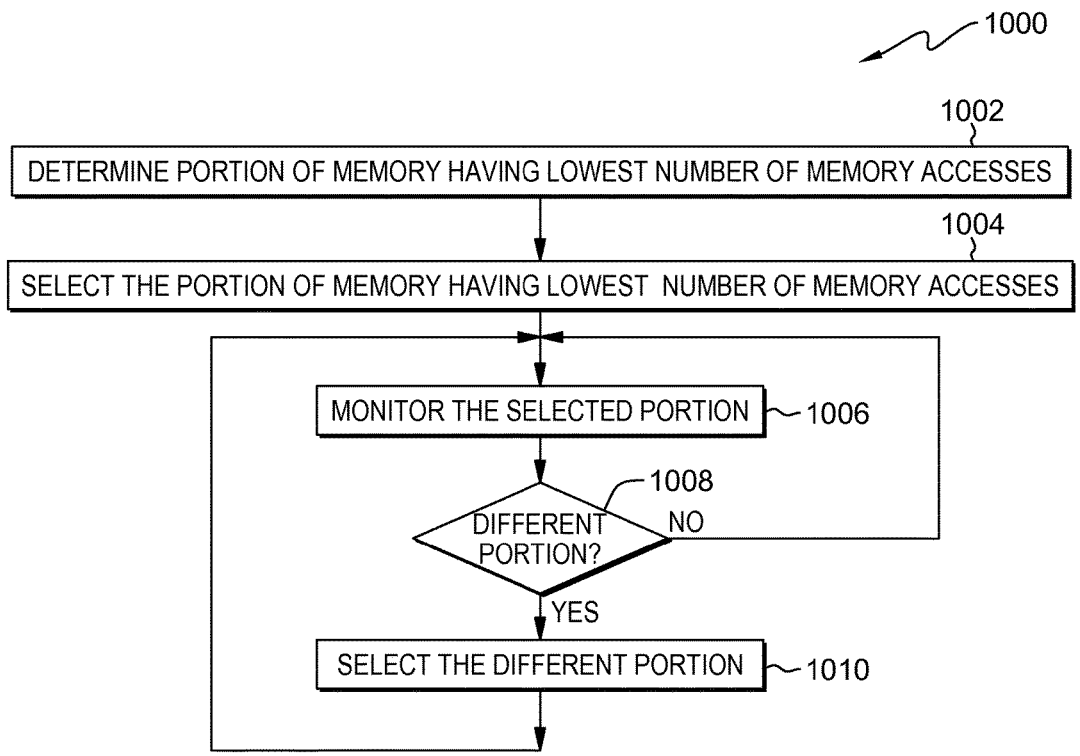
FIG. 10 is a flow chart depicting one embodiment of an illustrative method of adaptively monitoring memory accesses based on a track coldness mode.

FIG. 10 is a is a flow chart depicting one embodiment of an illustrative method 1000 of adaptively monitoring memory accesses based on a track coldness mode. FIG. 10 is similar to FIG. 9. However, in place of determining the highest cumulative number of counts, as in FIG. 9, the lowest number of counts (i.e. the coldest portion of memory) is determined in method 1000. In particular, at block 1002, the portion of memory (e.g. rank) having the lowest number of memory accesses during a given time window is determined. For example, in some embodiments, the cumulative count discussed above, can be maintained for a moving window of previous sampling periods. Thus, in such embodiments, the portion of memory having the highest cumulative count for the moving time window is determined.

At block 1004, the portion of memory having the lowest cumulative count is selected for monitoring in a next sampling period. For example, in some embodiments, the banks of a rank having the lowest cumulative count during the given time window are selected for monitoring during the next sampling period. At block 1006, the selected portion of memory is monitored for memory accesses (e.g. read and write accesses). At block 1008, it is determined if a different portion of memory has a lower cumulative count. For example, in embodiments having a moving time window, the portion of memory having the lowest cumulative count may change as a result of moving the time window. If the portion of memory having the lowest cumulative count is the same, then the method 900 returns to block 1006 where the selected portion of memory is monitored for the next subsequent sampling period. If a different portion of memory has the lowest cumulative count, then the different portion of memory is selected for monitoring during the next subsequent sampling period at block 1010. At block 1006, the different portion of memory is monitored. The method 1000 then returns to block 1008 to determine if a new portion of memory different from the one previously monitored has the lowest cumulative count (e.g. is the coldest portion of memory). The method 1000 then continues in this loop to adaptively change which portion of memory is monitored based on the relative coldness of the respective portions of memory.

Figure 11:
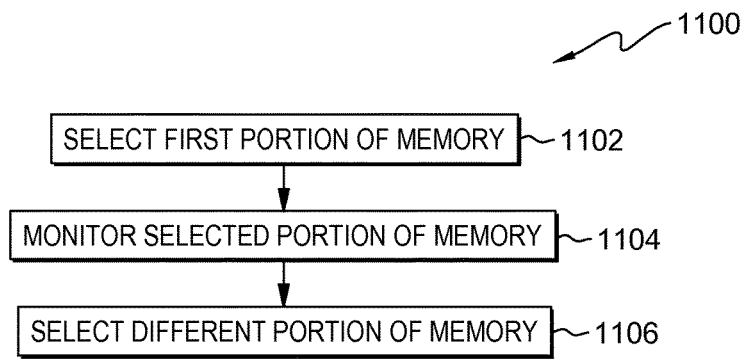
FIG. 11 is a flow chart depicting one embodiment of an illustrative method of adaptively monitoring memory accesses based on a round robin mode.

FIG. 11 is a flow chart depicting one embodiment of an illustrative method of adaptively monitoring memory accesses based on a round robin mode. At block 1102, a first portion of memory is selected. The portion of memory can be a rank of a memory module, a bank of a memory module, or a memory buffer, such as the memory buffer 114 in the memory controller 104 discussed above.

At block 1104, the selected portion of memory is monitored during a respective sampling period to count the number of memory accesses. At block 1106, a different portion of memory is selected (e.g. a different rank, different bank, etc.). The method then loops back to block 1104 where the different selected portion of memory is monitored during a respective next sampling period. The method 1100 then continues to block 1106 where another different portion of memory is selected. Thus, the round robin mode can rotate selection between rank level event, bank level events, and memory buffer level events, as discussed herein. In particular, in some embodiments, the round robin mode is configured to first select memory buffer level, then rank level and then bank level. In this way, each portion of the memory is monitored in respective sampling periods.

Figure 12:
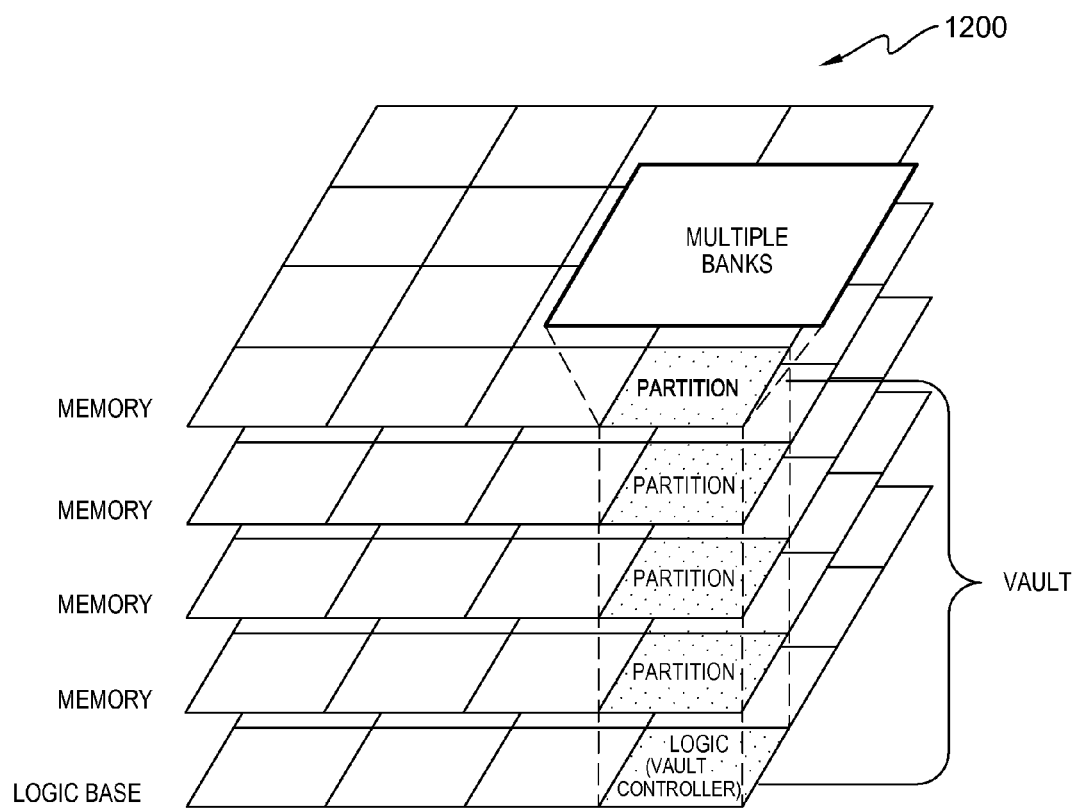
FIG. 12 is a diagram depicting one embodiment of an illustrative Hybrid Memory Cube memory structure.
Figure 13:
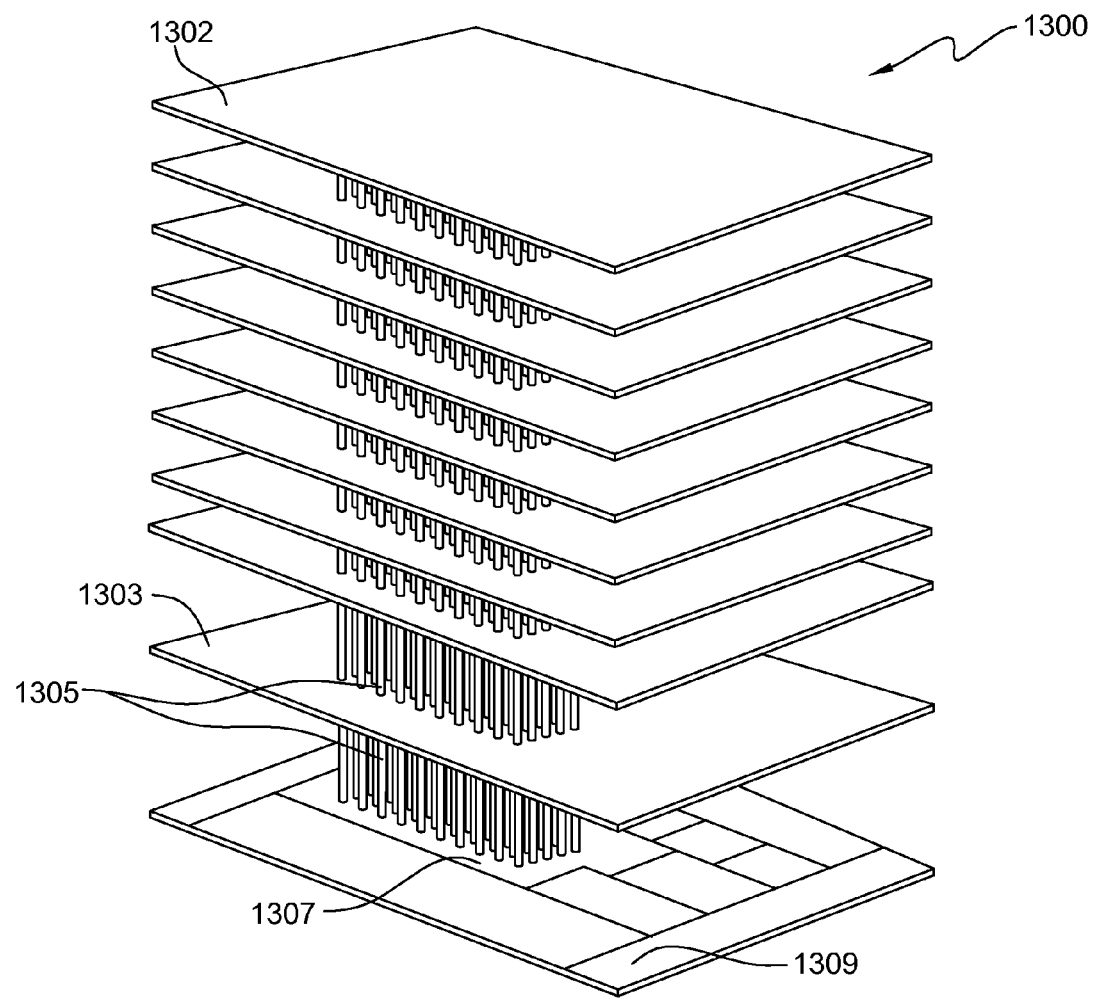
FIG. 13 is a diagram depicting one embodiment of an illustrative memory sub-system implementing a Hybrid Memory Cube memory.

The embodiments described above for adaptively monitoring memory performance can be implemented in various memory technologies. For example, the bank level monitoring can be implemented in Hybrid Memory Cube (HMC) memories, such as the illustrative HMC memory structure 1200 depicted in FIG. 12. In particular, the bank level monitoring described herein can be used to monitor the multiple memory banks of a vault 1202. One example memory sub-system 1300 implementing having a HMC memory is shown in FIG. 13. The memory sub-system 1300 includes a plurality of memory layers 1301 coupled to a memory controller 1303 via a plurality of through silicon vias (TSV) 1305. The memory controller 1303 is also coupled to cache 1307 of a processor layer 1309 via a plurality of TSVs 1305. The memory controller 1303 can be configured to adaptively monitor the memory layers 1301 using the techniques described herein.

Figure 14:
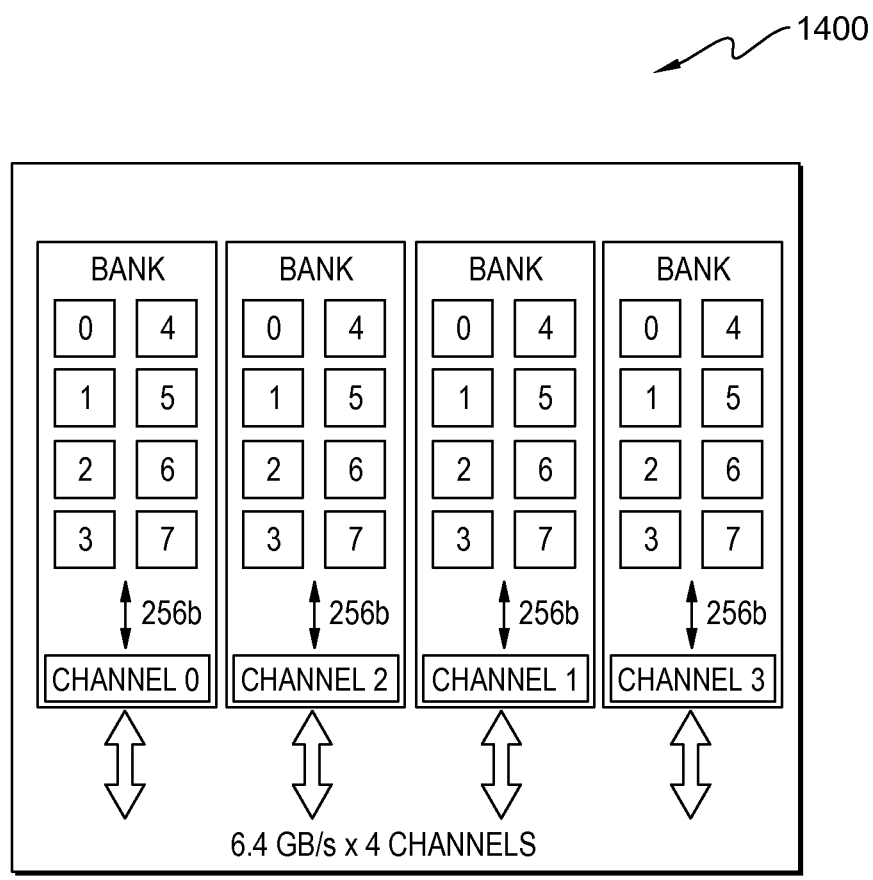
FIG. 14 is a diagram depicting one embodiment of an illustrative wide input/output memory structure.

It is to be understood that applications of the techniques described herein are not limited to Hybrid Memory Cube memories. For example, the techniques described herein can also be implemented in wide input/output (WideIO) memories, such as the illustrative WideIO memory 1400 depicted in FIG. 14 which has multiple memory banks stacked in groups per channel.

One or more of the functions of the performance measurement unit described above can be implemented via hardware components known to one of skill in the art and/or via a processing unit which includes or functions with software programs, firmware or other computer readable instructions for carrying out various methods, process tasks, calculations, and control functions described above to adaptively monitor memory performance.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Example Embodiments

Example 1 includes a method of monitoring memory performance. The method comprises selecting a first portion of memory from two or more portions of memory in accordance with an adaptive mode indicated by configuration bits in a control register; monitoring memory accesses to the selected portion of memory during a first sampling period; selecting a different portion of memory from the two or more portions of memory in accordance with the adaptive mode for monitoring the different portion of memory in a subsequent sampling period; monitoring memory accesses to the different portion of memory during the subsequent sampling period; recording a respective number of memory accesses for each portion of memory over a plurality of sampling periods; and generating one or more interrupts to output data regarding the monitored memory accesses for data analysis.

Example 2 includes the method of Example 1, wherein selecting the first portion of memory comprises determining which of the two or more portions of memory has the highest number of memory accesses during a given time window; and selecting the portion of memory having the highest number of memory accesses. The different portion of memory is selected in response to determining that the respective number of memory accesses of the different portion of memory has subsequently increased such that the different portion of memory has more memory accesses than the first portion of memory.

Example 3 includes the method of Examples 1, wherein selecting the first portion of memory comprises determining which of the two or more portions of memory has the lowest number of memory accesses during a given time window; and selecting the portion of memory having the lowest number of memory accesses. The different portion of memory is selected in response to determining that the respective number of memory accesses of the different portion of memory is subsequently lower than the number of memory accesses of the first portion of memory.

Example 4 includes the method of any of Examples 1-3, wherein selecting the different portion of memory for monitoring in the subsequent sampling period comprises selecting each of the two or more portions of memory in a respective subsequent sampling period such that each of the two or more portions is monitored in a round robin fashion.

Example 5 includes the method of any of Examples 1-4, wherein generating the one or more interrupts comprises generating each interrupt at predetermined time intervals.

Example 6 includes the method of any of Examples 1-4, wherein generating the one or more interrupts comprises generating each interrupt when a counter configured to count the number of memory accesses has reached a predetermined limit.

Example 7 includes the method of any of Examples 1-6, wherein each of the two or more portions of memory comprises one of a rank of a memory module coupled to a memory controller, a bank of a memory module coupled to a memory controller, or a memory buffer in a memory controller.

Example 8 includes a memory controller. The memory controller comprises a plurality of memory interfaces. Each of the plurality of memory interfaces communicatively coupled to a respective memory module comprising at least one rank and at least one bank. The memory controller further comprises a profiler configured to maintain a record of respective memory accesses to each rank and to each bank of each memory module and a control unit configured to adaptively select which portion of the respective memory modules coupled to the plurality of memory interfaces to monitor for each of a plurality of sampling periods based on one of a track hotness mode, a track coldness mode, and a round robin mode as indicated by bits in a control register. The memory controller also includes a counter configured to count the respective number of memory accesses to the selected portion of the memory modules during the respective sampling period. The control unit is further configured to generate interrupts periodically to provide data from the counter to a processor for data analysis.

Example 9 includes the memory controller of Example 8, wherein the control unit is configured to adaptively select which portion of the respective memory modules to monitor based on the track hotness mode. The control unit is also configured to retrieve data from the profiler regarding the number of memory accesses for each rank and to select the rank having the highest number of memory accesses for monitoring in the next sampling period.

Example 10 includes the memory controller of Example 8, wherein the control unit is configured to adaptively select which portion of the respective memory modules to monitor based on the track coldness mode. The control unit is also configured to retrieve data from the profiler regarding the number of memory accesses for each rank and to select the rank having the lowest number of memory accesses for monitoring in the next sampling period.

Example 11 includes the memory controller of any of Examples 8-10, wherein the control unit is configured to adaptively select which portion of the respective memory modules to monitor based on the round robin mode. The control unit is also configured to rotate selection of each rank of the respective memory modules coupled to the plurality of memory interfaces such that each rank is monitored in a respective sampling period.

Example 12 includes the memory controller of Example 11, wherein the memory controller further comprises a memory buffer. The control unit is further configured to rotate selection of each rank of the respective memory modules coupled to the plurality of memory interfaces and the memory buffer such that each rank and memory buffer events are monitored in a respective sampling period.

Example 13 includes the memory controller of any of Examples 8-12, wherein the control unit is further configured to generate interrupts at predetermined time intervals.

Example 14 includes the memory controller of any of Examples 8-12, wherein the control unit is further configured to generate an interrupt when the counter has reached a predetermined limit.

Example 15 includes a memory sub-system. The memory sub-system comprises a processor; a plurality of memory modules each comprising at least one rank and at least one bank; and a memory controller having a plurality of memory interfaces, each memory interface communicatively coupled to a respective one of the plurality of memory modules. The memory controller further comprises a performance measurement component configured to maintain a record of respective memory accesses to each rank and to each bank of each memory module and to adaptively select which portion of the respective memory modules to monitor for each of a plurality of sampling periods based on one of a track hotness mode, a track coldness mode, and a round robin mode as indicated by bits in a control register. The performance measurement component is further configured to count the respective number of memory accesses to the selected portion of the memory modules during the respective sampling period and to generate interrupts periodically to provide the counted number of memory accesses to the processor for data analysis.

Example 16 includes the memory sub-system of Example 15, wherein the performance measurement component is configured to adaptively select which portion of the respective memory modules to monitor based on the track hotness mode. The performance measurement component is also configured to select the rank having the highest number of memory accesses for monitoring in a next sampling period.

Example 17 includes the memory sub-system of Example 15, wherein the performance measurement component is configured to adaptively select which portion of the respective memory modules to monitor based on the track coldness mode. The performance measurement component is further configured to select the rank having the lowest number of memory accesses for monitoring in a next sampling period.

Example 18 includes the memory sub-system of any of Examples 15-17, wherein the performance measurement component is configured to adaptively select which portion of the respective memory modules to monitor based on the round robin mode. The performance measurement component is configured to rotate selection of each rank of the respective memory modules coupled to the plurality of memory interfaces such that each rank is monitored in a respective sampling period.

Example 19 includes the memory sub-system of Example 18, wherein the memory controller further comprises a memory buffer. The performance measurement component is configured to rotate selection of each rank of the respective memory modules coupled to the plurality of memory interfaces and the memory buffer such that each rank and memory buffer events are monitored in a respective sampling period.

Example 20 includes the memory sub-system of any of Examples 15-19, wherein the performance measurement unit is further configured to generate interrupts at predetermined time intervals.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method of monitoring memory performance, the method comprising:
    selecting a first portion of memory from two or more portions of memory in accordance with an adaptive mode indicated by configuration bits in a control register;
    monitoring memory accesses to the selected portion of memory during a first sampling period;
    selecting a different portion of memory from the two or more portions of memory in accordance with the adaptive mode for monitoring the different portion of memory in a subsequent sampling period;
    monitoring memory accesses to the different portion of memory during the subsequent sampling period;
    recording a respective number of memory accesses for each portion of memory over a plurality of sampling periods;
    generating one or more interrupts to output data regarding the monitored memory accesses during the first sampling period and during the subsequent sampling period for workload and usage data analysis; and
    analyzing, using the workload and usage data analysis, how the memory modules behave when peak bandwidth workload is run and how power management is handled when low workload bandwidth is run.

2. The method of claim 1, wherein selecting the first portion of memory comprises:
    determining which of the two or more portions of memory has the highest number of memory accesses during a given time window; and
    selecting the portion of memory having the highest number of memory accesses;
    wherein the different portion of memory is selected in response to determining that the respective number of memory accesses of the different portion of memory has subsequently increased such that the different portion of memory has more memory accesses than the first portion of memory.

3. The method of claim 1, wherein selecting the first portion of memory comprises:
    determining which of the two or more portions of memory has the lowest number of memory accesses during a given time window; and
    selecting the portion of memory having the lowest number of memory accesses;
    wherein the different portion of memory is selected in response to determining that the respective number of memory accesses of the different portion of memory is subsequently lower than the number of memory accesses of the first portion of memory.

4. The method of claim 1, wherein selecting the different portion of memory for monitoring in the subsequent sampling period comprises selecting each of the two or more portions of memory in a respective subsequent sampling period such that each of the two or more portions is monitored in a round robin fashion.

5. The method of claim 1, wherein generating the one or more interrupts comprises generating each interrupt at predetermined time intervals.

6. The method of claim 1, wherein generating the one or more interrupts comprises generating each interrupt when a counter configured to count the number of memory accesses has reached a predetermined limit.

7. The method of claim 1, wherein each of the two or more portions of memory comprises one of a rank of a memory module coupled to a memory controller, a bank of a memory module coupled to a memory controller, or a memory buffer in a memory controller.

8. The method of claim 1, further comprising:
    monitoring traffic access patterns for each portion of memory.

9. The method of claim 1, wherein the first sampling period and the subsequent sampling period are defined by one or more user inputs.

10. The method of claim 1, wherein the subsequent sampling period is defined dynamically based on the monitoring of memory accesses to the selected portion of memory during the first sampling period.

11. The method of claim 1, wherein the control register contains configuration bits in an adaptive mode field, a rank select field, a bank select field, and a device level select field.

12. The method of claim 1, further comprising:
modifying, based on the usage data analysis, a memory subsystem which contains the two or more portions of memory by adjusting an amount of energy supplied to one or more portions of the memory sub-system.

13. The method of claim 1, wherein the developing the detailed memory characterization for both the peak bandwidth driving workload and the low bandwidth workload further comprises developing a rank level stress distribution across the two or more portions of memory.

14. The method of claim 1, wherein the developing the detailed memory characterization for both the peak bandwidth driving workload and the low bandwidth workload further comprises collecting data regarding how power management is handled when a low workload bandwidth is run.

* * * * *